US006638625B1

United States Patent
Draeger

(10) Patent No.: US 6,638,625 B1
(45) Date of Patent: Oct. 28, 2003

(54) LINEAR NANOPOSITIONING TRANSLATIONAL MOTION STAGE BASED ON NOVEL COMPOSITE MATERIALS

(75) Inventor: Norman A. Draeger, Oregon, WI (US)

(73) Assignee: nPoint, Inc., Madison, WI (US)

(*) Notice: Subject to any disclaimer, the term of this patent is extended or adjusted under 35 U.S.C. 154(b) by 245 days.

(21) Appl. No.: 09/668,837

(22) Filed: Sep. 22, 2000

Related U.S. Application Data

(60) Provisional application No. 60/155,099, filed on Sep. 22, 1999.

(51) Int. Cl.$^7$ .............................................. B32B 27/38
(52) U.S. Cl. ...................... 428/413; 428/418; 428/457; 428/471; 428/704; 74/490.01; 74/490.08
(58) Field of Search ................................ 428/413, 408, 428/418, 457, 471, 704; 74/490.01, 490.08

(56) References Cited

U.S. PATENT DOCUMENTS

| | | | | |
|---|---|---|---|---|
| 3,811,633 A | * | 5/1974 | Cummings et al. | ........... 242/54 |
| 4,702,770 A | | 10/1987 | Pyzik et al. | |
| 5,026,595 A | * | 6/1991 | Crawford et al. | ........... 428/246 |
| 5,429,997 A | | 7/1995 | Hebsur | |
| 5,508,120 A | | 4/1996 | Pyzik et al. | |
| 5,676,610 A | * | 10/1997 | Bhatt et al. | .................. 473/566 |
| 5,903,085 A | * | 5/1999 | Karam | ........................ 310/328 |
| 6,346,160 B1 | * | 2/2002 | Puppin | ........................ 156/88 |
| 6,484,602 B1 | * | 11/2002 | Dagalakis et al. | ........ 74/490.08 |

OTHER PUBLICATIONS

Semke, W.H., Engelstad, R.L., Lovell, E.G., and Liddle, J.A., "Dynamic analysis of a Scalpel mask during electron–beam exposure," *J. Vac. Sci. Technol. B*, 16:3587–3591 (Ref. 3).

Fu, J., Young, R.D., and Vorburger, T.V., "Long–range scanning for scanning tunneling microscopy," *Rev. Sci. Instrum.* 63:2200–2205, 1992 (Ref. 5).

Meli, F. and Thalmann, R., "Long–range AFM profiler used for accurate pitch measurements," *Meas. Sci. Technol.*, 9:1087–1092, 1998 (Ref. 6).

Chang, S.H. and DU, B.C., "A precision piezodriven micropositioner mechanism with large travel range," *Rev. Sci. Instrum.*, 69:1785–1791, 1998 (Ref. 7).

Gonda, S., Kurosawa, T. and Tanimura, R., :Mechanical performances of a symmetrical, monolithic three–dimensional fine motion stage for nanometrology, *Meas. Sci. Technol.*, 10:986–993, 1999 (Ref. 8).

Smith, S.T., Chetwynd, D.G., and Bowen, D.K., "Design and assessment of monolithic high precision translation mechanisms," *J. Phys. E.*, 20:977–983, 1987 (Ref. 9).

Karandikar, P.G., Chou, T.W., Parvizi–Majidi, A., Takeda, N., and Kishi, T., "Silicon carbide (Nicalon™)fibre–reinforced borosilicate glass composites: mechanical properties," *J. Mater. Sci.*, 32: 6459–6469, 1997 (Ref. 11).

Kagawa, Y., Kurosawa, N., and Kishi, T., "Thermal shock resistance of SiC fibre–reinforced borosilicate glass and lithium aluminosilicate matrix composites," *J. Mater. Sci.*, 28:735–741, 1993 (Ref. 12).

Hebsur, M.G., "Development and characterization of $SiC_{(f)}$/$MoSi_2$–$Si_3N_{4(p)}$ hybrid composites," *Mater. Sci. Engin.* A261:24–37, 1999 (Ref. 13).

Pyzik, A. and Beaman, D.R., "A1–B–C phase development and effects on mechanical properties of $B_4C$/A1–derived composites," *J. Am. Ceram. Soc.*, 78:305–312, 1995 (Ref. 16).

Yamaguchi, M., Tanaka, Y., and Tanaka, K., "Influence of aging and wetting on dynamic mechanical properties of multi–functional epoxy resins filled with pitch–based carbon short fibers," *Adv. Composite Mater.*, 7:117–135, 1998 (Ref. 21).

* cited by examiner

*Primary Examiner*—Robert Dawson
*Assistant Examiner*—Christopher Keehan
(74) *Attorney, Agent, or Firm*—Joseph T. Leone, Esq.; DeWitt Ross & Stevens S.C.

(57) ABSTRACT

A nanopositioner made of novel materials is provided. The materials exhibit desirable properties such as low density and low coefficient of thermal expansion (CTE) derived from their ceramic matrices, but show even better (higher) Young's modulus of elasticity and flexural strength than neat ceramics. The materials are also amenable to wire electric discharge machining.

19 Claims, 4 Drawing Sheets

LINEAR NANOPOSITIONING TRANSLATIONAL MOTION STAGE BASED ON NOVEL COMPOSITE MATERIALS

CROSS-REFERENCE TO RELATED APPLICATIONS

This application claims priority under 35 USC §119(e) to U.S. provisional patent application Serial No. 60/155,099, filed Sep. 22, 1999, the entirety of which is incorporated herein.

FIELD OF THE INVENTION

The invention relates to nanopositioners. In particular, the invention relates to novel materials for making nanopositioners.

BIBLIOGRAPHIC CITATIONS

Complete bibliographic citations to the references discussed herein are contained in the Bibliography section, directly preceding the claims.

BACKGROUND OF THE INVENTION

It is common knowledge that electronic devices continue to grow more powerful and more versatile at the same time as they continue to become physically smaller. Only a few years ago, line widths of the order of 0.5 μm were available from only the most advanced semiconductor manufacturers. Today, manufacturers routinely use 0.25 μm design-rules, with 0.18 1 μm beginning to come into play. Smaller feature sizes are on the horizon, providing the driving force for the development of next generation lithography techniques such as SCALPEL® (SCattering with Angular Limitation Projection Electron-beam Lithography) and Extreme Ultraviolet (EUV) photolithography.

With these changes comes a pressing need to inspect the wafers produced rigorously, and even to inspect some of the tools used to produce the wafers, such as advanced photomasks. With the smaller features it creates, next generation lithography demands use of critical dimension (CD) surface metrology that is faster and more accurate than ever. Providing CD metrology in turn requires the ability to move a probe across a surface to be inspected in the X and Y directions, and to be able to move the probe toward and away from that surface in the Z direction rapidly, repeatedly, precisely, and accurately.

Nanopositioners based upon flexure hinge designs provide this type of precise, fine-scale motion in X, XY, or XYZ directions. Nanopositioners also have been developed for use in precision machining, optical switching, cell physiology research, and other applications. The material currently used in fabricating the vast majority of such nanopositioners is Al 7075 alloy. Other aluminium alloys may be used in instances requiring compatibility with an ultra-high vacuum or non-magnetic service environment. Nanopositioners requiring extreme positioning precision (at the expense of speed) may be made from materials having a relatively low coefficient of thermal expansion (CTE), such as invar alloys. Nanopositioners made from the current materials provide only modest performance, where they can be used at all. Some further limited improvement in nanopositioner performance might be obtained with these materials using new designs for the flexure hinges and for the electronics driving the nanopositioner, especially in positioning feedback circuitry.

Significant changes in nanopositioner performance, however, will require changes in flexure design, and corresponding changes in driver design, that cannot be supported with current materials. In particular, the range of motion of nanopositioners utilizing flexure stages is not expected to exceed perhaps 300 micrometers using current materials; such nanopositioners in addition will require a physical size (footprint) inappropriately large for many applications. New materials having greater specific stiffness and flexural strength are the key to developing next-generation nanopositioners. Such new materials and linear flexure motion nanopositioners fabricated therefrom are described herein.

SUMMARY OF THE INVENTION

The invention, which is defined by the claims set out at the end of this specification, is intended to solve at least some of the problems noted above. A nanopositioner is provided that is fabricated from a ceramic matrix composite having a matrix material and a reinforcing phase. A preferred embodiment of the matrix material is a cermet, and more preferably is an aluminum boron-carbide or $MoSi_2$.

A preferred embodiment of the ceramic matrix composite is a graphite/epoxy composite, such as a graphite whisker/epoxy composite.

Another preferred embodiment of the ceramic matrix composite is a two-dimensional C/C composite. Preferably, the two-dimensional C/C composite is chemically converted to C/SiC or SiC/SiC after it is machined.

The ceramic matrix composite preferably has sufficient electrical conductivity to support wire electric discharge machining. This property supports the introduction of a flexure hinge pattern into a stage blank by wire electric discharge machining.

Also preferred is a ceramic matrix composite having a natural frequency for the first vibrational mode that is at least twice that of Al 7075 and having an out-of-plane motion that is a fraction of that experienced with Al 7075 for an identical stage design.

The reinforcing phase of the ceramic matrix composite preferably is an electrically conductive material, such as graphite whiskers or graphite fiber.

Further advantages, features, and objects of the invention will be apparent from the following detailed description of the invention in conjunction with the associated drawings.

DETAILED DESCRIPTION OF THE INVENTION

Figure 1A:
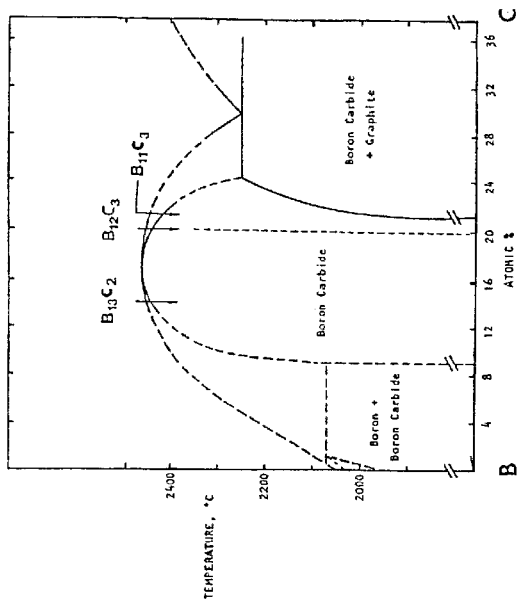
FIG. 1A is a boron/carbon binary phase diagram.

Nanopositioners based upon flexure hinge designs are finding increasing application in surface metrology (wafer and photomask inspection), precision machining, optical switching, cell physiology research, and other areas. Nanopositioner performance is characterized by range of motion (typically $\leq 100$ μm), out-of-plane motion (typically ≈1 nm) and speed (typically $10^2$–$10^3$ Hz). Current nanopositioners fabricated from Al 7075 generally exhibit only modest performance. These nanopositioners cannot adequately support certain applications, and all applications will benefit from improved nanopositioners. Such improvement may result in part from superior flexure designs and enhanced driver electronics. Truly significant improvement will come about only through use of advanced materials.

There are many material properties that will impact the ultimate performance of a nanopositioner. The four properties determined to be of greatest importance are the Young's modulus of elasticity, E, the density, ρ, the coefficient of thermal expansion (CTE), and the flexural strength, $\sigma_f$. The specific stiffness, E/ρ, is a particularly useful figure of merit. A stiffer and lighter material (higher E, lower ρ) results in a nanopositioner that is more stable and faster. However, attention needs to be paid to the flexural strength as well, as material stiffness often comes at the price of brittleness (i.e., poor flexibility).

Ceramics are among the stiffest and lightest materials available. However, they tend to be quite brittle. Ceramic matrix composites (CMCs) contain a reinforcing phase typically in the form of continuous fibers or whiskers that greatly improves the flexural strength of the ceramic.

Ideally, any material to be used for fabricating flexural hinge nanopositioners should have sufficient electrical conductivity to support machining of the precise flexure hinge pattern by wire EDM (electric discharge machining). While this is not a technical necessity, wire EDM is the preferred method for machining flexural hinges because of its speed, accuracy, and precision. Ceramics typically are very poor electrical conductors. One solution appears to be the use of cermets, hybrids between ceramics and metals, for the CMC matrix material. Another possibility is to use a good conductor such as graphite for the reinforcing phase of a CMC.

1.0 DESIRED PERFORMANCE CHARACTERISTICS
1.1 Nanopositioner Performance Characteristics In nanopositioners, it is desirable to have the following performance characteristics. The range of motion is preferably $\geq 500$ μm; and more preferably $\geq 1,000$ μm. The out-of-plane motion is preferably $\leq 1$ nm. There should be negligible to zero parasitic motions (roll, pitch, and yaw). The motion stage should also be operable at a high speed (in the range of $10^2$–$10^4$ Hz; with a typical speed expected to be 500–2,000 Hz). The positioning of the stage should be precise (e.g., $\leq 0.5$ nm), although this is often more a function of the driver than the material used.

1.2 Corresponding Material Mechanical Requirements

The above performance characteristics for the stage may be interpreted into mechanical requirements for the materials used to fabricate the nanopositioner. Guideline values include having a Young's modulus of elasticity (E)$\geq 150$ GPa; a density (ρ)$\leq 3$ g/cm$^3$, a flexural strength ($\sigma_f$) $\geq 250$–300 MPa, and a coefficient of thermal expansion, CTE (α)$\leq 4$ ppm/K. The specific stiffness=E/ρ is also an informative ratio regarding the suitability of material for use in flexural hinges, as discussed below.

Other important material properties to consider include a Poisson's ratio, ν, which expresses anisotropy of material deformation under load; electrical conductivity, which indicates ability to use wire EDM for machining; and thermal conductivity, which is related to CTE.

Two important considerations in comparing properties among materials include various mutually exclusive trade-offs between the mechanical characteristics of the various materials and the environment in which the nanopositioners ultimately will be used.

Trade-offs: Often there are mutually exclusive trade-offs among the key physical and mechanical properties of these new materials. For example, minimizing out-of-plane/parasitic motion and maximizing speed often must be traded off against each other. Higher values of E (Young's modulus) minimize out-of-plane/parasitic motion, while lower values of ρ (density) maximize the speed of the stage. The ratio E/ρ (specific stiffness) therefore is a valuable measure for comparing the overall suitability of a particular material for use in a flexural hinge to be used in a given application. On one hand, the higher this ratio, the more the competing needs of precision and speed are made compatible for a wide range of applications. On the other hand, a higher Young's modulus often results in a lower flexural strength, which is undesirable for flexure longevity.

Specificity: Specific applications may require different weighting of the relative importance of each property. This is related to the notion of physical and mechanical property trade-offs. For example, applications requiring high positioning precision may benefit from a lower CTE, even at the expense of higher material density; an invar alloy therefore might be appropriate for such an application.

2.0 MATERIAL CONSIDERATIONS
2.1 Mechanical Properties

In examining potential materials for nanopositioners, all four broad categories of materials initially were considered: metals, polymers, ceramics, and composites.

Metals, of course, include virtually all the materials currently used to fabricate nanopositioners. (The one exception is ZERODUR™-brand glass, a glass formulated by Schott Glaswerke in Mainz, Germany and having a nearly zero CTE. It is on rare occasions used for motion nanopositioners.) However, metals are not optimal materials for fabricating nanopositioners due to relatively high density and high CTE values. The high density in particular lowers the specific stiffness value to a maximum of about 25 or 26 GPa/g/cm$^3$, the value shown by aluminum alloys. Dimensional analysis of "specific stiffness" shows that 1 GPa/g/cm$^3$=$10^6$ (m/s)$^2$, i.e., it has units of (speed)$^2$, or kinetic energy/mass. This further illustrates that specific stiffness is an intensive material property, independent of the amount (mass) of the material being considered.

Some other metals such as magnesium or titanium show a specific stiffness equal to that of aluminum. However, these materials do not offer any advantage over aluminum and in fact often have drawbacks by comparison. For example, magnesium is more subject to chemical attack than is aluminum, and titanium is difficult to machine because it work hardens.

One interesting possibility to consider is silicon, with a specific stiffness of 48 GPa/g/cm$^3$. Silicon is not strictly a metal, but rather a "metalloid," one of the handful of representative elements in the Periodic Table between metals and nonmetals. As such it is less dense but also less ductile than are typical metals. Coupons of 99.995% silicon (1"×1"×0.5") were examined for machining by several techniques including wire EDM and abrasive waterjet (laser machining was not recommended for this material). No machining method was found that would satisfactorily support fabricating flexure hinge patterns into silicon. This is discussed further in Section 2.2.2.

Polymers fare even worse than do metals. The CTE of many polymers is 40 ppm/K or greater (60 ppm/K is not uncommon). The Young's modulus is extremely low, around 2 or 3 GPa (compared to 72 GPa for aluminum). Even the very low densities of polymers, typically well below 2 g/cm$^3$, cannot offset the other serious shortcomings.

Composites using metals or polymers as the matrix (MMCs and PMCs) begin to show improved properties compared to the neat materials. The addition of the discontinuous phase, whether whiskers or continuous fibers, greatly improves the Young's modulus without affecting the material density much. Thus, the specific stiffness is increased. In the case of continuous fiber composites, the CTE often is also somewhat improved (made closer to zero), presumably because the fibers provide a more efficient pathway for thermal conduction. However, these improvements still are not sufficient to produce a material more suitable for nanopositioner than the aluminum alloys currently used.

Thus, the material groups of metals, polymers, metal matrix composites, and polymer matrix composites were judged to be very poor possibilities for providing materials that will support the requirements needed for nanopositioners.

Ceramics were the next group to be considered. Compared to the material groups discussed above, ceramics tend to have values of Young's modulus of 120–350 GPa (roughly twice that of metals) with densities of 2–4 g/cm$^3$ (similar to polymers). The specific stiffness values for ceramics thus take a significant jump compared to these other groups, to around 100 GPa/g/cm$^3$. The CTE values also improve significantly, being around 3–6 ppm/K for ceramics. Flexural strengths tend to be above 300 MPa, although care must be used to avoid those ceramics with relatively low flexural strengths. At the same time, one needs to be alert for possible opportunities of ceramics with flexural strengths in excess of 600 MPa. Strictly from a material properties standpoint, ceramics appear to offer some exciting possibilities for nanopositioner fabrication.

An even better situation seems to be true for ceramic matrix composites (CMCs). As is the case for MMCs and PMCs, CMCs tend to show much the same values for density and CTE as do the corresponding neat matrix materials. The Young's modulus does not make the same jump in value between a neat ceramic and its CMC as it does between the neat matrix material and the corresponding composites in the cases of MMCs and PMCs. This is in large part because the whiskers or fibers in any composite material, regardless of matrix, often are ceramics themselves, and thus would be expected to have less of an impact on the elastic properties of composite verses neat material for CMCs. The flexural strengths of CMCs typically are higher than those for the corresponding neat ceramics.

Somewhat related to CMCs, glass matrix composites were considered. When developed five to ten years ago, these materials typically used SiC (sometimes graphite) reinforcement with a borosilicate (sometimes high silica) matrix (Refs. 11, 12). One set of published material properties includes a Young's modulus of 109 GPa and a flexural strength of 1100 MPa (relatively quite high). The density and CTE for borosilicate itself are 2.23 g/cm$^3$ and 3.25 ppm/K, respectively. These materials show properties that would be useful for fabricating nanopostioners. Materials of this type require diamond-tipped tools for machining. A flexure hinge pattern could be machined into SiC/borosilicate (composites will be indicated as reinforcement material/matrix material). However, the machining cost is estimated at about three times that for the current Al 7075 flexure stages, an estimate similar to the cost of machining a flexure stage from the machinable MACOR-brand ceramic (Corning, Corning, N.Y.).

Thus, ceramics and CMCs appear to offer many possible excellent materials for fabrication of nanopositioning stages. However, there remains one more very important consideration that was briefly touched upon in the earlier discussion of silicon. The ability to machine the material, especially to introduce the precise flexure hinge pattern and its throughcuts, is as important as any of the other material properties already discussed. That consideration will be presented next, followed by much further discussion of CMCs.

Table 1 summarizes properties of materials considered to be most relevant for use in the fabrication of nanopositioners. The materials are presented in three groups: (1) currently-used materials (for comparison); (2) "better" materials that are superior to the conventionally used materials; and (3) the preferred new materials for use in the flexural hinges of the present invention. It will be noted that the materials fall naturally into a ranking of increasing specific stiffness, the figure of merit discussed above. While there is some increase of specific stiffness within the members of a given group, in moving down the table from one group to the next, the specific stiffness roughly doubles in value.

TABLE 1

Summary of preferred properties of materials

| Material | Young's Modulus (E) Gpa | Flex Strength Mpa | CTE ppm/K | Density ($\rho$) g/cm$^3$ | Thermal Conductivity W/m/K | Spec. Stiff. E/$\rho$ |
|---|---|---|---|---|---|---|
| Currently Used Materials | | | | | | |
| Invar 35 | 148 | | 1.3 | 8.05 | 10.2 | 18 |
| 304 Stainless | 197 | 215 | 17.3 | 8 | 16.2 | 25 |
| Al 7075 | 72 | 70 | 23.6 | 2.81 | 130 | 26 |
| Better Materials | | | | | | |
| Si | 112 | | 2.6 | 2.33 | 150 | 48 |
| SiC/borosilic | 109 | 200–1100 | 3.25 (mtrx) | 2.33 (mtrx) | | 49 |
| SiC/Mo$_2$Si$_3$N | 280 | | 5.5 | 4.26 | | 66 |
| Most-Preferred New Materials | | | | | | |
| Grapht/Epoxy | 94 | | 0.5 | 1.25 | | 75 |
| Al—B$_4$C | 280 | 450 | 5.5 | 2.95 | 95 | |
| 2D C/C | 240 | 300–1300 | x −0.5<br>y −0.5<br>z 3 | 1.9 | x 350<br>y 350<br>z 40 | 126 |
| 2D C/SiC | 280 | 600–1000 | x 2.5<br>x 2.5<br>z 3.5 | 2.15 | x 340<br>y 340<br>z 38 | 130 |

2.2 MACHINABILITY PROPERTIES

2.2.1 Machining Techniques

Successful operation of a nanopositioning flexure hinge stage depends in large part on the quality of the machining of the flexure hinge pattern. For a simple single-axis stage with no mechanical amplification, the four hinges, one at each corner of the translating stage, must be as identical as possible. Any deviation from this likely will lead to parasitic motion such as pitch, roll, and yaw. In addition, out-of-plane motion needs to be controlled, and this too is in part a function of the care used in machining. More complicated stages, such as those combining X and Y motion, requires a correspondingly greater degree of care in fabrication.

The through-cuts made into the monolithic stage blank need to be of the specified dimensions, including cantilever width and length and kerf (i.e., groove) width. The cuts should have parallel sides without tapering as they go through the plane of the stage.

All manufacturers of flexure hinge nanopositioners claim to use wire electric discharge machining (wire EDM) for fabrication from metallic blanks. This technique provides the level of quality described above with a reasonable machining time and cost. Potential alternatives to this method include the following.

Laser machining: This technique has a good record of smaller-scale precision machining for a variety of applications. It operates on the simple principle of melting the workpiece material at the small localized volume being machined at any given moment. This unavoidably generates spent material called magma or ejecta from the machined area. The magma typically is not completely removed from the workpiece. This can interfere with proper functioning of a precision positioning stage, and may not present a commercially acceptable appearance. In addition, through-plane cuts made via laser machining may not have completely parallel sides. The remaining workpiece material on either side of the cut will be a "recast layer," that is, material resolidified after cooling from the melting action of the laser. This imparts different material properties to this area of the workpiece compared to the rest of the piece.

Abrasive waterjet machining: This technique uses a very high pressure, focused stream of water bearing fine particles of grit, typically garnet. The stream mechanically cuts through a workpiece and removes spent material from the piece. There is no recast layer produced. However, the through-plane cuts do not have parallel sides. The smallest kerf width that can be obtained is about 500–600 $\mu$m, compared to 350 $\mu$m currently achieved with wire EDM. The exact effects on nanopositioner performance resulting from nonparallel sides and larger kerf width to the cuts made for the flexure hinge pattern are not known.

Diamond tool machining: This technique is a straightforward mechanical cutting action into the workpiece. Spent material is completely removed and a recast layer should not be formed if heat resulting from friction does not become excessive. All but the very hardest materials (such as some carbides and diamond itself) may be machined with this technique. If the machining is done properly, cuts should be straight in-plane and with parallel sides through-plane. The principle disadvantage of diamond tool machining is that it can be relatively labor-intensive, thus driving up the per unit cost of stages made. There also may be greater variability of results from one stage to the next (of the same design). Variability from one flexure hinge to the next within the same stage would, of course, be totally unacceptable.

2.2.2 Comparison of Alternate Machining Techniques to Wire EDM

Initially, silicon appeared to be a promising material (see the discussion in Section 2.1). However, laser machining is not appropriate for silicon. Moreover, high-purity silicon does not have sufficient conductivity to support wire EDM. A cumbersome approach explored was to sandwich the usual 12 mm-thick silicon blank between two conductive plates, thereby forcing the silicon into a sufficiently conductive state to allow for wire EDM. This approach is very inefficient, however, because only one stage can be fabricated with each machining operation rather than the three or four stages typically fabricated simultaneously when using aluminum blanks. The resulting silicon stages therefore cannot be priced aggressively. Numerous attempts to machine silicon blanks via abrasive watejet resulted in shattering of the blank as it was first pierced by the jet.

Silicon blanks are, however, highly amenable to diamond tool machining, despite the drawbacks inherent in this type of machining.

The above brief considerations of alternate machining techniques do not address all the aspects of machining a particular material for the specific application of a nanopositioning flexure hinge stage. However, the gist is conveyed: given an electrically conductive material, wire EDM is the preferred machining method. It provides for complete removal of spent material from the workpiece, the cuts made are straight with parallel sides and small kerf width, and it can be automated to increase reproducibility and decrease costs.

Therefore, there remains the major requirement of electrical conductivity of the material. As discussed above, the most promising class of materials in terms of specific stiffness, CTE, and flexural strength are ceramic-matrix composites. Yet, ceramics typically are very good electrical insulators. Thus, there is the major challenge of what appears to be incompatible goals of material properties and machinability.

2.3 CMCs Supporting EDM

In light of the above, the present inventor embarked upon a search for CMCs that show sufficient electrical conductivity to support wire EDM and display the above-noted characteristics desirable in flexural hinges.

2.3.1 Cermets (General)

Cermets are materials that behave as hybrids of ceramics and metals (hence the name), showing some of the most desirable properties of each. In Table 1, one of the "better" materials is a composite of SiC fibers in a matrix of $MoSi_2$—$Si_3N_4$. Silicon nitride, on one hand, is a classic ceramic. It has a relatively low density (3.3 g/cm$^3$) and low CTE (3.3 ppm/K) with a high Young's modulus (310 GPa) but a flexural strength that is not very high, i.e., it is quite brittle. Molybdenum disilicide, on the other hand, is a well-known cermet used to make resistors and heating elements. Its density (6.2 g/cm$^3$) is similar to that of a metal, its Young's modulus (377 GPa) behaves like a ceramic, and its CTE (6.5 ppm/K) falls between the range for metals and ceramics. It is believed to be the $MoSi_2$ that gives this composite enough electrical conductivity to be machinable by wire EDM.

2.3.2 Reacted Aluminum-Boron Carbide (R-AlBC)

Another cermet material for use in the present invention is reacted aluminum/boron carbide (R-AlBC). This material appears to be superior to the SiC/$MoSi_2$—$Si_3N_4$ described in the last paragraph (see Table 1). While both materials have the same Young's modulus of 280 GPa and CTE of 5.5 ppm/K, the density of R-AlBC is just over ⅔ that of SiC/$MoSi_2$—$Si_3N_4$, giving R-AlBC a specific stiffness that is nearly 50% higher. At the same time, R-AlBC displays very high electrical conductivity, and thus can be machined quite readily via wire EDM.

R-AlBC is somewhat different in composition from a traditional composite. It does not have distinct continuous and discontinuous phases normally associated with composite materials. Rather, R-AlBC has a microstructure characterized by isolated $B_4C$ grains or clusters of $B_4C$ grains surrounded by a multiphase matrix that comprises aluminum borides, aluminum borocarbides and free metal, and a dense surface layer of aluminum oxide, the surface layer being substantially free of carbon. Preparing R-AlBC begins with a porous $B_4C$ preform. The preform is made from a water suspension of $B_4C$ powder (average particle size 3 μm) that is chemically treated, aged, then molded, and carefully baked at 1400–1800° C. for 1–2 hours. This porous preform is infiltrated with molten Al 1145 alloy to form a green body. The Al—$B_4C$ green body is heat treated, causing the Al and $B_4C$ to react. By carefully controlling this heat treatment in terms of upramp, soak temperature and soak time, and downramp, it is possible to form a final material that utilizes one or more of a variety of compounds on the Al—B—C ternary phase diagram. Compounds on this diagram include $AlB_{24}C4$, $AlB_{40}C_4$, $Al_2B_{51}C_8$, and $Al_8 B_4C_7$, among others.

Heat treatment above about 600° C. provides a multiphase ceramic material containing only a small amount of residual material. Heat treatment between about 600 and 700° C. produces mainly $AlB_2$; heat treatment between about 700 and 900° C. results in a mixture of $AlB_2$ and $Al_4BC$. Heat treatment between about 900 and 980° C. produces primarily $Al_4BC$; and heat treatment between about 1000 to 1050° C. results in $AlB_{24}C_4$ with small amounts of $Al_4C_3$, so long as the heating does not exceed 5 hours. Deleterious $Al_4C_3$ is avoided by processing below about 1000° C.

Figure 1B:
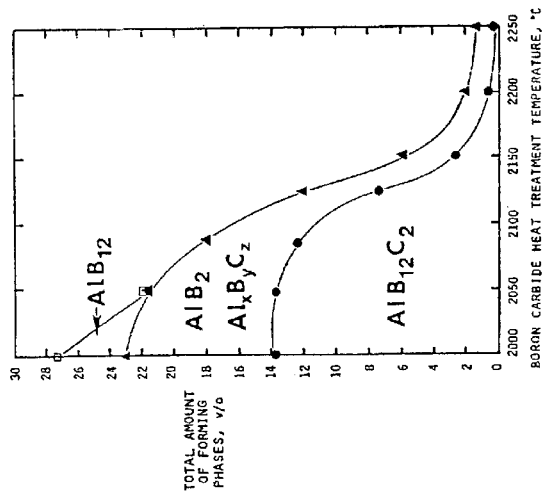
FIG. 1B is a drawing demonstrating the relationship between the kinetics of chemical reaction in a boron carbide-aluminum system and the temperature of boron carbide heat treatment.

The exact composition of the R-AlBC material, and therefore its mechanical properties, may be closely tailored to meet specific applications by varying the processing parameters used during material preparation. This is a potentially very powerful aspect of this material system. FIG. 1 pictorially summarizes some of these relationships. More will be said about this below.

Machinability of R-AlBC: Machining R-AlBC presents challenges that are manageable with some experience and care. The material as formed into stock tiles has a moderately rough exterior. The as-formed surface can be smoothed to a very acceptable metallic-looking finish using a standard aluminum oxide grinding wheel operated in a dry mode. This procedure is however somewhat labor intensive.

For stages fabricated from aluminum alloy, the cavities which must be introduced into the stage blank to accommodate the piezoelectric actuator stack and the positioning sensor are made by a standard milling operation. The R-AlBC, however, is too tough to permit this. As an alternative, the cavities were introduced into the stage blank using a "sinking" or "plunge" EDM technique. This technique consists of machining graphite electrodes in the shape of a template of the cavities, and then hitting the blank in one high-power operation where the template is gradually forced into the blank. Some follow-up EDM may be required to clean up the cavities. In the case of R-AlBC, sinking EDM results in a certain amount of preferential removal of residual aluminum metal compared to the aluminum-boron carbide phases. This leaves a very minor amount of fine surface pitting inside the cavities. This in no way affects operation of the stage, and does not mar the cosmetic appearance of the stage.

R-AlBC blanks are readily machined using wire EDM, behaving much like a metal in this respect.

2.3.3 Two-Dimensional Carbon/Carbon Composite (2-D C/C)

The next material to be extensively investigated was a two-dimensional carbon/carbon composite. This material is available commercially from Materials and Electrochemical Research Corporation (MER Corp.) of Tucson, Ariz. Visual inspection of the exposed surface of this material suggests that the fiber tows are of the order of 2 mm in diameter. The tow array is a two-dimensional 90° meshwork, with mesh openings of approximately 2 mm. While the exact composition of this material is not known, based on a recent publication by MER, it is believed the 2-D C/C is fabricated using polyacrylonitrile-based carbon fabric and a thermoset-based resin with active fillers and that a single heat treatment up to 2300° C. was employed.

Machinability of 2-D C/C: The 2-D C/C material is amenable to conventional machining methods (milling) for introducing the piezoelectric actuator and sensor cavities into the stage blank. The material also is amenable to the use of wire EDM for creating the flexure hinge pattern. Visual evaluation of initial EDM test cuts shows that there is a certain amount of frayed fiber ends in the kerfs of the cuts.

The cuts also apparently will have a somewhat larger kerf width. Current stages fabricated with Al 7075 have a kerf width of 360 μm. Again, inspection of initial cuts suggests that the kerf width in the 2-D C/C material will be about 430 μm. It is likely that somewhat larger kerf width may simply be incorporated into the totally new flexure design that is expected to be needed to fully exploit the properties of a new material.

2.3.4 SiC Matrix Composites: C→SiC Conversion

Other composites for use in the present invention are C/SiC and SiC/SiC. Initially, SiC itself was also considered. However, while its physical and mechanical characteristics are quite suitable, it is very difficult to machine. For example, α-SiC has a relatively high Young's modulus of 410 GPa (365 GPa for β-SiC), a density of 3.1 g/cm$^3$, and a CTE of 4 ppm/K. (The specific stiffness, then, is 132 GPa/g/cm$^3$, higher than any of the materials listed in Table 1.) However, SiC also is a very poor electrical conductor, and will not support wire EDM. It is a difficult material to machine even with conventional methods. Introducing the piezoactuator and sensor cavities into an SiC stage blank is quite challenging, even more so than it is for R-AlBC. Unlike R-AlBC plunge EDM will not work for SiC.

However, some of these difficulties can be overcome using chemical vapor reaction, a reaction for converting C into SiC. The technique involves exposing a carbon body to SiO gas under pressure and high temperature for a period of time, generally in the order of a few tens of hours. The conversion can be controlled to proceed either partially or, for bodies that are not too thick, to 100% completion. The reaction results in a volume change of the carbon body of from about 3–4%. The conversion obeys the following reaction:

$$SiO_{(g)} + 2C_{(s)} \rightarrow SiC_{(s)} + CO_{(g)} \qquad \text{(Equation 1)}$$

It is therefore possible to produce a flexure hinge nanopositioner by starting with a blank of carbon/carbon composite, machining the cavities (milling) and flexure pattern (wire EDM) into the blank, and then chemically converting the machined piece into C/SiC or SiC/SiC composite. The higher porosity of the matrix results in a substantially higher conversion rate. The process works whether the original carbon reinforcement is in the form of whiskers or continuous fibers.

Rather than being a burdensome "extra step," this conversion process opens up exciting opportunity for manipulating flexure stage fabrication, thus tailoring it to specific applications. For example, it may be possible to localize the chemical conversion at the four flexure hinges only. This would produce flexure hinges with a high Young's modulus while leaving the nanopositioner itself relatively light (density of graphite=2.27 g/cm$^3$ compared to density of SiC=3.1 g/cm$^3$), thereby contributing to a higher "speed" for the stage. The entire device would still be fabricated from a monolithic piece, eliminating the need for a discrete joint between the SiC/SiC flexure hinges and the C/C composite nanopositioner. The stage would instead be joined to each hinge by a chemically graded transition from one material to the other. This would serve to ease the small CTE mismatch between carbon and SiC.

2.3.5 Graphite/Epoxy Composite

Yet another material for use in the present invention is graphite/epoxy composite. This material is a "traditional" composite having clearly-defined continuous and discontinuous phases. However, the discontinuous phase is graphite whiskers, rather than the much larger continuous fibers of the 2-D C/C material described above. The graphite/epoxy may be thought of (to a first approximation) as something of a compromise between the two materials described above. It has a more homogeneous distribution of discontinuous phase among the continuous phase than does 2-D C/C, but the composition of graphite/epoxy is not quite as homogeneous as is believed to be the case for R-AlBC.

Suitable graphite/epoxy composites can be purchased from Material Innovations, Inc. (MII) of Huntington Beach, Calif. Fibers as used in composites typically have diameters of 10–15 $\mu$m; this consistently appears in the literature. Individual fibers are entwined to form fiber tows (similar to making yarn from thread) with diameters of 1000–2500 $\mu$m. This diameter is of the same size as the width of the flexure hinges in nanopositioning stages. Preferably, the tow diameter should be no more than 10–25% the size of the smallest feature of the final piece to be fabricated from a piece of composite. This suggests use of whiskers rather than continuous fibers. In fact, the material supplied by MII uses whiskers of the usual 10–15 $\mu$m diameter with lengths of 1000–3000 $\mu$m.

Machinability of graphite/epoxy composite: The graphite/epoxy has electrical conductivity sufficient to support wire EDM. It is known that this material also will support conventional machining operations such as milling.

3.0 PROTOTYPE STAGES

3.1 Fabrication

Stages were fabricated that are identical to each other in design, but which differed in the material used. Each stage was carefully characterized with respect to range of motion, out-of-plane motion, parasitic motion in-plane (roll, pitch, and yaw), and other features. Comparisons were made, and the materials were ranked according to desirability of stage fabrication.

3.1.1 R-AlBC

The as-received material was ground with a standard aluminum oxide wheel (dry mode operation) to a very acceptable surface finish that permits further machining operations and provides a finished product that is cosmetically acceptable. Next, "sinking" EDM was done on the piece (as described above), using drawings for a PIEZOMAX-brand PMX-MH-25 nanopositioning stage (Piezomax Technologies, Madison, Wis.) as a design for the type of cavities required for a working stage. The flexure hinge pattern of the PMX-MH-25 stage was then machined into the piece.

Such a nanopositioning stage was fabricated from R-AlBC as described hereinabove. Due to the several and somewhat labor-intensive steps required, this material would likely be a relatively expensive material with which to work on a commercial scale. Nonetheless, the resultant R-AlBC stage performed admirably, displaying a highly desirable combination of speed and stiffness. Because of its excellent performance characteristics, the higher fabrication costs may be justifiable for certain applications.

3.1.2 2-D C/C

Four PIEZOMAX-brand PMX-MH-25-type stages were fabricated from 2-D C/C. Of these four stages, two were characterized as-is and two were returned to MER, the material provider, for chemical conversion into C/SiC and SiC/SiC composite materials. This will provide stages of three different material compositions (2-D C/C, C/SiC, and SiC/SiC) but all having same flexure design. These are to be characterized and compared to the other PMX-MH-25 stages produced from R-AlBC and graphite/epoxy (and from the baseline material, Al 7075).

The stages made from 2-D C/C are amenable to wire EDM, however the kerf widths attainable are somewhat larger than attainable using metal substrates. At present, kerf widths on the order of about 430 $\mu$m are readily attainable with the 2-D C/C composites, as compared to a kerf width of 360 $\mu$m readily attained when using Al 7075. The effect, if any, of this 20% increase in kerf width on stage performance using the PMX-MH-25-type stage design appears to be negligible. To the extent that the larger kerf width lead to undesirable properties in certain specific applications, the larger kerf width will be factored into new stage designs from the outset, thereby taking the best advantage of the mechanical properties of the new material.

3.1.3 Graphite/Epoxy

Graphite/epoxy stages are fabricating using the standard PMX-MH-25 stage design, as described above.

3.2 Finite Element Analysis

Figure 2:
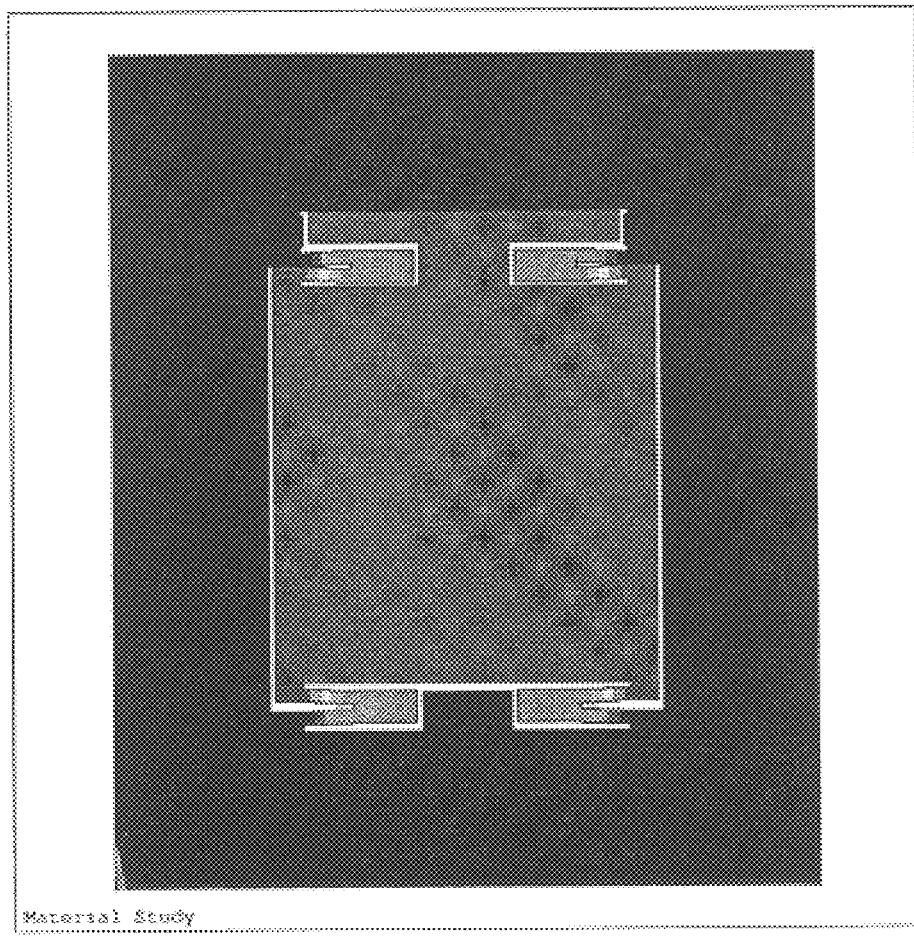
FIG. 2 is a top plan schematic of an XY nanopositioner having four flexure hinges (one at each corner) and depicts an in-plane mode shape for the first natural frequency.

Initial finite element analysis was performed to model the behavior of the PMX-MH-25 stages, using the mechanical properties of Al 7075, 2-D C/C, 2-D C/SiC, and R-AlBC as given by the material suppliers. The analysis showed that the natural frequency for the first vibrational mode occurs at about 4 kHz, 9 kHz, 9 kHz, and 8 kHz, respectively, for the materials (see Table 2 below and FIG. 2). This means that a PMX-MH-25-type stage made from one of these materials can be operated at speeds at least twice as high as the current product fabricated from aluminum alloy. These findings also indicate that these materials will yield a flexure design that will operate at the current 3 kHz speed, but over a significantly greater range of motion.

TABLE 2

Natural frequencies for the first five modes in Hz

| Mode | Al 7075 | 2-D C/C | 2-D C/SiC | R—AlBC |
|---|---|---|---|---|
| 1 | 3991 | 9107 | 9247 | 7894 |
| 2 | 5995 | 13632 | 13842 | 11817 |
| 3 | 7505 | 17086 | 17349 | 14811 |
| 4 | 7967 | 17410 | 17678 | 15092 |
| 5 | 10042 | 21961 | 22299 | 19037 |

Figure 3:
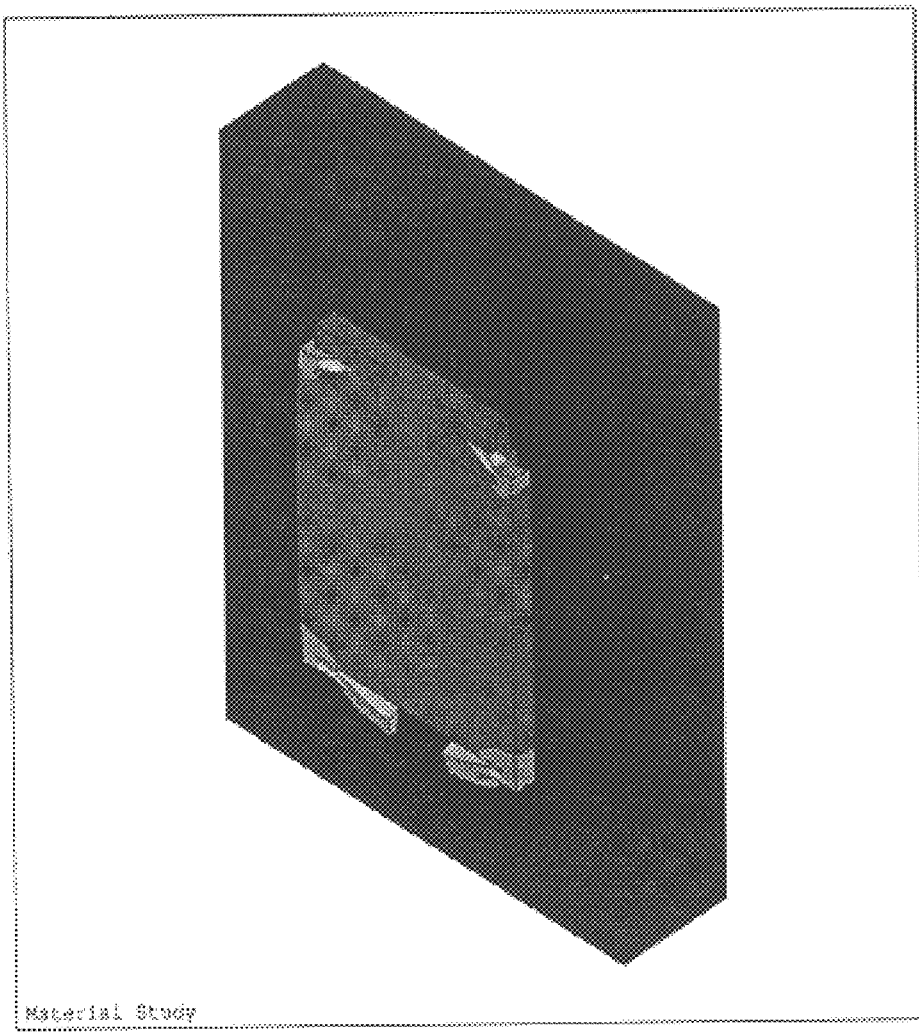
FIG. 3 is a top plan schematic of an XY nanopositioner having four flexure hinges (at the corners) and depicts an out-of-plane displacement.

The modeling also looked at out-of-plane motion when the stage is driven at a 9.81 N distributed transverse load, which is a large load relative to that actually used in practice (see Table 3 and FIG. 3).

TABLE 3

Maximum predicted out-of-plane displacements due to a 9.81 N transverse load

| Material | Maximum Out-of-Plane Displacement (microns) |
|---|---|
| Al 7075 | 16.86 |
| 2-D C/C | 5.23 |

TABLE 3-continued

Maximum predicted out-of-plane
displacements due to a 9.81 N transverse load

| Material | Maximum Out-of-Plane Displacement (microns) |
| --- | --- |
| 2-D C/SiC | 4.48 |
| R—AlBC | 4.48 |

Figure 4:
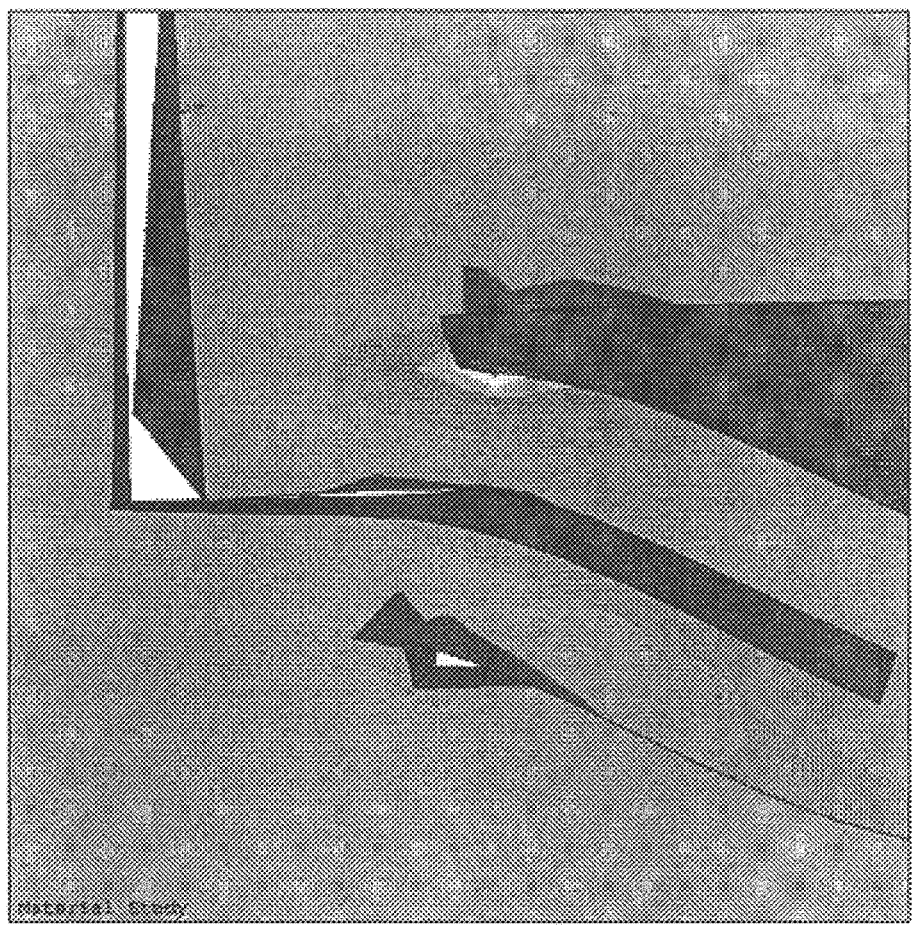
FIG. 4 is a close up schematic of the maximum stress contours in one of the flexures of the nanopositioner shown in FIG. 3.

The out-of-plane motion experienced with the R-AlBC and 2-D C/C materials is about ⅓ to ¼, respectively, that experienced with Al 7075. The maximum stress experienced under this loading does not vary among these three materials by more than about ±6% (see Table 4 below and FIG. 4). However, the flexural strength of R-AlBC and 2-D C/C is about 4–6 times that of Al 7075, so that, again, flexures fabricated from the new materials can be driven "harder" and/or over a greater range than can current flexures. The graphite/epoxy composite material is expected to deliver performance enhancement comparable to the R-AlBC and 2-D C/C materials.

TABLE 4

Maximum stress values in the flexures

| Material | Maximum Stress (MPa) |
| --- | --- |
| Al 7075 | 208 |
| 2-D C/C | 221 |
| 2-D C/SiC | 221 |
| R—AlBC | 221 |

3.3 PHYSICAL CHARACTERIZATION

Characterization involves both measuring the stage performance and carefully examining the various stage materials in terms of their physical structure and the chemical composition. Stage performance is measured in terms of range of motion, out-of-plane motion, and in-plane parasitic motion. Range of motion measurements are made using an interferometer assembled at Piezomax Technologies. An interferometer is capable of measuring very small distances very accurately. The out-of-plane and parasitic motions are measured with a technique using an atomic force microscope (AFM). Very briefly, the AFM is used to measure the distance that the nanopositioner rises out of plane (that is, in the Z direction) when the stage is displaced through a certain known distance along one axis in-plane (that is, in the X or Y direction). To obtain an accurate measurement, a small piece of highly smooth-surfaced silicon wafer is tightly bonded to the surface of the stage being examined. In this manner, the AFM measures against the extremely flat surface of the silicon wafer, thereby eliminating any spurious readings due to the roughness of the stage surface itself.

A scanning electron microscope (SEM) is used to examine the physical structure of the stage materials. This is especially important when the stage has received a post-machining chemical or thermal treatment. Along with SEM inspection, stages are subjected to a preliminary chemical analysis by energy dispersion spectroscopy (EDS). Where needed, a particular stage (material) may undergo more thorough chemical characterization in an effort to gain a more thorough understanding of how the changed chemistry of the material relates to stage performance.

Nanopositioners have been fabricated from 2-D C/C, using Piezomax' G-X-25 design. Using AFM, the out-of-plan motion was shown to be between +/−3 nm over a 5 to 20 μm in-plane linear movement of the nanopositioner. This range of out-of-plane motion lies within the uncertainty range of the AFM methodology itself.

The in-plane resonant frequency of a G-X-25 stage fabricated from Al 7075 and from 2-D C/C as a function of loading have been compared with quite favorable results. Using loads ranging from 0 to 50 g, the 2-D C/C nanopositioner exhibited a first resonance of from about 10 to about 6 kHz, as compared to a range of from about 2.2 to 1.8 kHz over this same range for the Al 7075 stage.

4.0 Applications

The obvious application for the materials concepts described herein are high precision nanopositioners based on flexure hinge designs. There are other applications as well, including flexible couplings and specialty bearings.

Nanopositioners find widespread application notably in surface metrology, but also in precision machining, optical switching, and cell physiology research. Metrology applications include several aspects of the semiconductor industry, including inspection of fabricated wafers and inspection and repair of photomasks used to make the wafers. Following are examples of applications for the nanopositioners made of the materials described herein.

A use of the nanopositioners made of the materials described herein is surface metrology. Surface/Interface, Inc. (S/II) of Sunnyvale, Calif. is a major innovator and manufacturer of instruments and technologies used to perform surface metrology. The company's Stylus NanoProfilometer (SNP) is designed to inspect finished wafers and photomasks. An important part of the SNP is the ability to move a measuring probe from one location to another over a small area of a surface to be inspected quickly and accurately. Further still, the probe must be positioned at each location to contact the surface without altering (damaging) either the surface or the probe itself. Consequently, accurate manipulation of the probe itself is a primary consideration in increasing the sensitivity of these types of profilometers. The nanopositioners made of the materials described herein will advance this positioning and sampling ability significantly.

Another application of the new nanopositioners made of the materials described herein is precision machining. For example, Clarke Manufacturing, Inc. of Milwaukee, Wis. is a company dedicated to precision machining, especially Swiss turning machining, with wide application in orthopedics, otologic implants, and orthoscopic surgical instruments. Next-generation nanopositioners using the stiffer materials described herein will enhance precision machining by producing a finer surface finish, thereby eliminating the additional costly step of post-machining grinding. The stiffer stages also will provide smooth, continuous advancement of tooling bits against the surface of workpieces, rather than the step advancement currently used. "Chatter" of the tooling bit will, quite literally, be eliminated.

Nanopositioners made of the materials described herein can also be employed in manufacturing optical switches based on conformal mechanism designs, i.e., a relatively simple flexure. These switches represent the leading edge of a revolution in telecommunications and data transmission. Materials with higher specific stiffness and lower CTE, such as those described herein, will produce optical switches that are faster and more reliable.

Additionally, the new nanopositioners can be utilized in flexible couplings, which are used in machinery to couple rotating shafts that are misaligned, either deliberately or as a result of retrofitting newer components into older designs. They also assist rotating shafts in providing a "torque buffer"

during wind-up and wind-down. Current flexible couplings are made from steel cylinders typically 1–3 cm in diameter by 2–10 cm long. The cylinders have carefully-designed helical through-cuts along the wall. Stiffer materials of the type being considered in this project will provide a greater range of materials from which to fabricate flexible couplings, thus making them available to a broader range of applications. Ceramic matrix composites are lighter and more corrosion-resistant than the steels currently used, and these are attributes industry seeks.

The invention is not limited to the preferred embodiments described above, but rather is limited only by the claims set out below. Thus, the invention encompasses all alternate embodiments that fall literally or equivalently within the scope of these claims.

What is claimed is:

1. A nanopositioner comprising a monolithic stage blank of composite material selected from the group consisting of ceramic matrix composites, polymer matrix composites, and graphite/epoxy composites, the monolithic stage blank having machined therein at least one flexural hinge.

2. The nanopositioner of claim 1, wherein the composite material comprises a cermet.

3. The nanopositioner of claim 2, wherein the cermet comprises an aluminum boron-carbide or $MoSi_2$.

4. The nanopositioner of claim 1, wherein the composite material has sufficient electrical conductivity to support wire electric discharge machining.

5. The nanopositioner of claim 4, wherein the composite material comprises a phase selected from the group consisting of graphite whiskers, graphite fibers, or $MoSi_2$.

6. The nanopositioner of claim 1, wherein the composite material comprises a ceramic matrix composite.

7. The nanopositioner of claim 1, wherein the composite material comprises a polymer matrix composite.

8. The nanopositioner of claim 1, wherein the composite material comprises a graphite/epoxy composite.

9. The nanopositioner of claim 1, wherein the composite material comprises a $SiC/MoSi_2$—$Si_3N_{4c}$ composite.

10. The nanopositioner of claim 1, wherein the composite material comprises a reacted aluminum/boron carbide composite.

11. The nanopositioner of claim 1, wherein the composite material comprises a two-dimensional carbon/carbon composite.

12. The nanopositioner of claim 1, wherein the composite material comprises a carbon/silicon carbide composite.

13. The nanopositioner of claim 1, wherein the composite material comprises a silicon carbide/silicon carbide composite.

14. A nanopositioner comprising a monolithic stage blank of composite material selected from the group consisting of C/SiC composites and SiC/SiC composites, the monolithic stage blank having machined therein at least one flexural hinge, the flexural hinge fabricated by first forming a carbon pre-form, machining at least one flexural hinge into the carbon pre-form to yield a machined pre-form, and then reacting the machined pre-form with SiO for a sufficient time and under suitable conditions to convert the machined preform into a C/SiC or SiC/SiC composite.

15. The nanopositioner of claim 14, wherein the composite material is a C/SiC composite.

16. The nanopositioner of claim 14, wherein the composite material is a SiC/SiC composite.

17. The nanopositioner of claim 14, wherein the flexural hinge is machined into the carbon pre-form by wire electric discharge machining.

18. In a nanopositioner fabricated from a monolithic blank of material, the improvement comprising a flexural hinge stage fabricated from a composite material selected from the group consisting of ceramic matrix composites, polymer matrix composites, and graphite/epoxy composites.

19. The improvement of claim 18, wherein the composite material is selected from the group consisting of SiC/$MoSi_2$—$Si_3N_4$, reacted aluminum/boron carbide, two-dimensional carbon/carbon composites, C/Si, and SiC/SiC.

* * * * *